United States Patent
Kubo et al.

(10) Patent No.: US 12,336,436 B2
(45) Date of Patent: Jun. 17, 2025

(54) ETCHING METHOD

(71) Applicant: Tokyo Electron Limited, Tokyo (JP)

(72) Inventors: Takuya Kubo, Tokyo (JP); Hiroki Maehara, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 505 days.

(21) Appl. No.: 17/656,536

(22) Filed: Mar. 25, 2022

(65) Prior Publication Data
US 2022/0320423 A1 Oct. 6, 2022

(30) Foreign Application Priority Data
Apr. 2, 2021 (JP) .................. 2021-063628

(51) Int. Cl.
*H10N 50/01* (2023.01)
*H01J 37/32* (2006.01)
*H10B 61/00* (2023.01)

(52) U.S. Cl.
CPC ......... *H10N 50/01* (2023.02); *H01J 37/3244* (2013.01); *H10B 61/00* (2023.02); *H01J 2237/334* (2013.01)

(58) Field of Classification Search
CPC ................ H10N 50/01; H01J 37/3244; H01J 2237/334; H10B 61/00
See application file for complete search history.

(56) References Cited

U.S. PATENT DOCUMENTS

| | | | |
|---|---|---|---|
| 2017/0125668 A1* | 5/2017 | Paranjpe | H10N 50/80 |
| 2021/0287727 A1* | 9/2021 | Tsubata | G11C 11/161 |
| 2022/0102624 A1* | 3/2022 | Yun | H01J 37/32146 |

FOREIGN PATENT DOCUMENTS

| | | |
|---|---|---|
| JP | H06-291094 A | 10/1994 |
| JP | 2013-140891 A | 7/2013 |
| JP | 2013-243307 A | 12/2013 |
| JP | 2019-160938 A | 9/2019 |
| WO | 2006129374 A1 | 12/2006 |

* cited by examiner

*Primary Examiner* — Shih Tsun A Chou
(74) *Attorney, Agent, or Firm* — Armstrong Teasdale LLP (57) ABSTRACT

An etching method of etching a wafer by sputtering using ions in plasma includes accommodating the wafer in an internal space of a plasma processing apparatus, and etching a multilayer film by sputtering using ions. The wafer includes a multilayer film containing a non-volatile material and a mask layer on a surface of the multilayer film, and an exposed space of a region not covered by the mask layer. An aspect ratio h/D obtained by dividing a height h of the mask layer by a distance D between two adjacent sidewalls of the mask layer satisfies a condition: h/D≥1/(tan (φ)−tan (θ)). θ indicates an inclination angle of the sidewalls with a vertical surface perpendicular to the surface. φ indicates an upper limit of an incidence angle of ions on the vertical surface. φ is larger than θ.

14 Claims, 12 Drawing Sheets

ETCHING METHOD

CROSS-REFERENCE TO RELATED APPLICATION

This application is based upon and claims the benefit of priority from Japanese Patent Application No. 2021-063628, filed on Apr. 2, 2021, the entire contents of which are incorporated herein by reference.

TECHNICAL FIELD

An exemplary embodiment of the present disclosure relates to an etching method executed in the manufacture of a magnetoresistive effect element.

BACKGROUND

A magnetoresistive effect element including a magnetic tunnel junction (MTJ) layer is used in a device such as a magnetoresistive random access memory (MRAM). In the manufacture of the magnetoresistive effect element, etching of a multilayer film is performed. The etching executed in the manufacture of the magnetoresistive effect element may be performed based on a fine pattern. Such etching is described in Patent Document 1.

PRIOR ART DOCUMENT

[Patent Document]
Japanese Laid-Open Patent Publication No. 2014-002336

SUMMARY

According to one embodiment of the present disclosure, there is provided an etching method of etching a wafer by sputtering using ions in plasma generated by a plasma processing apparatus, wherein the wafer includes a multilayer film containing a non-volatile material and a mask layer provided on a surface of the multilayer film, and an exposed space that is a region not covered by the mask layer is provided on the surface so that the surface is exposed in the exposed space, wherein an aspect ratio h/D obtained by dividing a height h of the mask layer on the surface by a distance D between two adjacent sidewalls of the mask layer which define a portion of the exposed space on the surface satisfies a condition: h/D≥1/(tan (φ)−tan (θ)), where θ indicates an inclination angle of the sidewall with respect to a vertical plane intersecting the sidewall and perpendicular to the surface, and φ indicates an upper limit of an incidence angle of ions generated by sputtering on the vertical plane, wherein φ is larger than θ, and wherein the etching method including accommodating the wafer in an internal space of a chamber of the plasma processing apparatus, and etching the multilayer film by sputtering using ions in plasma generated from a processing gas supplied into the internal space.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, various exemplary embodiments will be described.

In the manufacture of an MRAM device, there may be difficulty in machining a transition metal or a magnetic film used for a storage medium. That is, in a machining method (ion milling) using a physical sputtering phenomenon of argon ions, since selectivity with a mask is low and sputtered atoms are attached to an etching sidewall, there may be a limit to the miniaturization of an MRAM device. Therefore, a method of manufacturing an MRAM device is being studied in which the substrate is rotated such that an etching amount by an ion beam incident from a side in a direction in which a pattern groove formed on the substrate extends is larger than an etching amount by an ion beam incident from a side in an oblique direction. This makes it possible to form a fine pattern by suppressing the deposition of a re-attached film at the bottom of a pattern groove (hole). However, in securing further miniaturization, an ion beam from a side in an oblique direction does not reach the bottom of the pattern groove (hole), which may make it difficult to achieve accurate etching. Therefore, it is desired to develop an etching method capable of further miniaturizing an MRAM device.

In an exemplary embodiment, a method of etching a wafer by sputtering using ions in plasma generated by a plasma processing apparatus is provided. The wafer includes a multilayer film including a non-volatile material and a mask layer provided on the surface of the multilayer film, and an exposed space that is a region not covered by the mask layer is provided on the surface so that the surface is exposed in the exposed space. An aspect ratio (h/D) obtained by dividing the height (h) of the mask layer on the surface by a distance (D) between two adjacent sidewalls of the mask layer that define a portion of the exposed space on the surface satisfies the following conditions. That is, h/D satisfies a condition: $h/D \geq 1/(\tan(\varphi) - \tan(\theta))$ in which $\theta$ indicates the inclination angle of the sidewall with respect to a vertical plane that intersects the sidewall and is perpendicular to the surface and $\varphi$ indicates the upper limit of the angle of incidence of ions, which are generated by sputtering, on the vertical plane. $\varphi$ is greater than $\theta$. This etching method includes the following two steps. In the first step, a wafer is accommodated in an interior space of a chamber of a plasma processing apparatus. In the subsequent step, the multilayer film is etched by sputtering using ions in the plasma generated from the processing gas supplied into the internal space.

As a result of research, the inventors have found that by applying the above-described etching method to a wafer including a mask layer having a high aspect ratio satisfying the above-mentioned condition, it is possible to reduce a dimensional increase caused by the deposited film attached to the sidewalls of the mask, and thus vertical machining becomes possible.

In an exemplary embodiment, when $\theta$ is 0 degrees, the condition is $h/D \geq 1/\tan(10°)$.

In an exemplary embodiment, the mask layer includes a convex portion that defines a portion of a pattern and an outer peripheral region that surrounds the outer periphery of the convex portion. The exposed space includes the space between the convex portion and the outer peripheral region. The outer peripheral region is removed after the step of etching the multilayer film.

In an exemplary embodiment, the mask layer includes a pattern region having a plurality of convex portions that defines a pattern, and an outer region provided outside the pattern region. The exposed space includes the space between the pattern region and the outer region. The outer region is removed after the step of etching the multilayer film.

In an exemplary embodiment, the processing gas includes a rare gas.

In an exemplary embodiment, the processing gas further includes carbon dioxide gas, hydrocarbon gas, hydrogen gas, oxygen gas, fluorine gas, and nitrogen gas.

In an exemplary embodiment, the rare gas contained in the processing gas includes at least one among Ar gas, Ne gas, and Kr gas.

In an exemplary embodiment, the non-volatile material contained in the multilayer film includes at least one among any one metal included in a metal group consisting of Ru, Ir, Co, Fe, Mg, Pt, W, Mo, and Ni, an alloy compound, a metal oxide, and a metal nitride. The alloy compound is a compound composed of two or more metals contained in the metal group. The metal oxide is an oxide of any one of the metals contained in the metal group. The metal nitride is a nitride of any one metal contained in the metal group.

In an exemplary embodiment, the material of the mask layer includes at least one among Ti, TiN, Ta, and TaN.

Hereinafter, various exemplary embodiments will be described in detail with reference to the drawings. In each drawing, the same or corresponding components will be denoted by the same reference numerals.

Figure 1:
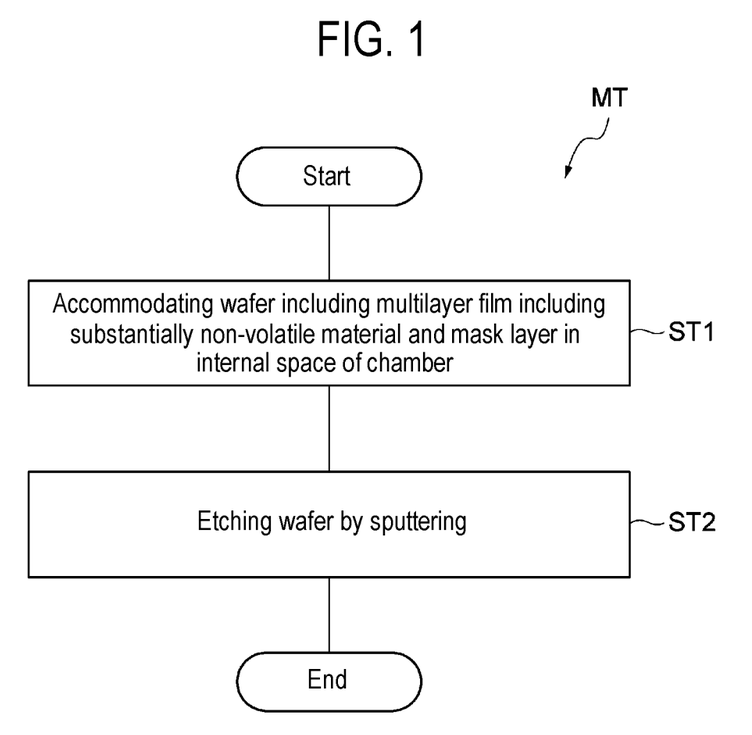
FIG. 1 is a flowchart illustrating an etching method according to an exemplary embodiment.

FIG. 1 is a flowchart illustrating an etching method according to an embodiment. The etching method illustrated in FIG. 1 (hereinafter, referred to as a "method MT") is a method of etching a wafer by sputtering using ions in plasma generated by a plasma processing apparatus, and may be executed, for example, in the manufacture of a magnetoresistive effect element.

Figure 2:
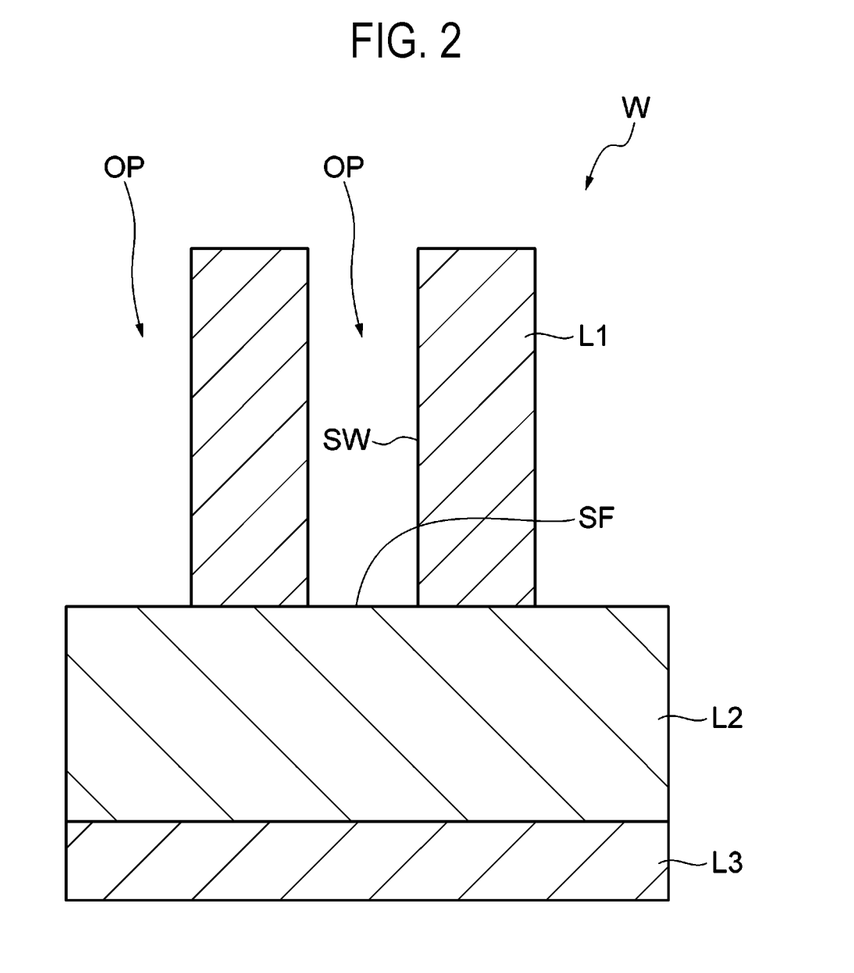
FIG. 2 is a cross-sectional view illustrating an outline of a multilayer film and a mask layer of an exemplary wafer.

FIG. 2 is a cross-sectional view illustrating an outline of a multilayer film and a mask layer of an exemplary wafer. The method MT may be executed for etching the multilayer film L2 of the wafer W illustrated in FIG. 2. In an embodiment, the wafer W is an MRAM device. As illustrated in FIG. 2, the wafer W has a mask layer L1, a multilayer film L2, and a base layer L3. The multilayer film L2 is provided on the base layer L3, and the mask layer L1 is provided on the surface SF of the multilayer film L2. On the surface SF, an exposed space OP, which is a region not covered by the mask layer L1 and in which the surface SF is exposed, is provided.

The mask layer L1 has a shape that defines a pattern formed on the wafer W. The material of the mask layer L1 contains at least one selected from a group consisting of, for example, Ti, TiN, Ta, and TaN.

The multilayer film L2 includes at least a magnetic tunnel junction layer (MTJ layer) and an electrode layer. The multilayer film L2 contains a non-volatile material. The non-volatile material contained in the multilayer film L2 includes at least one of any one metal included in a metal group consisting of, for example, Ru, Ir, Co, Fe, Mg, Pt, W, Mo, and Ni, an alloy compound, a metal oxide, or a metal nitride. The above-mentioned alloy compound is a compound composed of two or more metals included in the above-mentioned metal group. The above-mentioned metal oxide is an oxide of any one of the metals included in the above-mentioned metal group. The above-mentioned metal nitride is a nitride of any one of the metals included in the above-mentioned metal group. In an embodiment, a MTJ pillar, a line-and-space structure, a hole, or the like of the MRAM device may be formed from the multilayer film L2.

The base layer L3 is made of a material such as $SiO_2$ or SiN.

Figure 3:
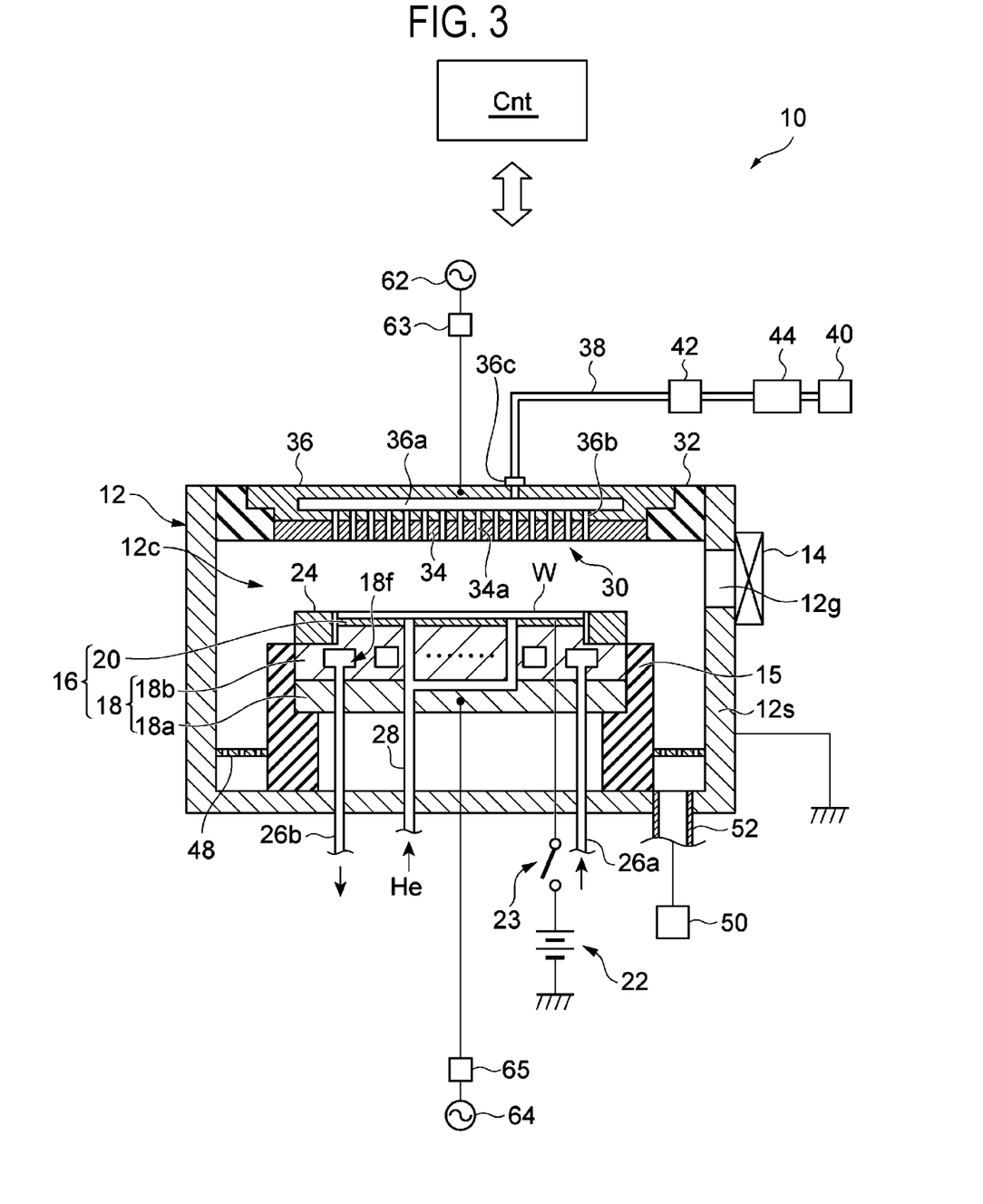
FIG. 3 is a view schematically illustrating an example of a plasma processing apparatus capable of being used to execute the etching method illustrated in FIG. 1.

Hereinbelow, the method MT will be described by taking a case of being applied to the wafer W illustrated in FIG. 2 as an example. In the method MT, a plasma processing apparatus is used. FIG. 3 is a view schematically illustrating an example of a plasma processing apparatus capable of being used to execute the etching method illustrated in FIG. 1. FIG. 3 schematically illustrates the structure of the vertical cross section of the plasma processing apparatus. The plasma processing apparatus 10 illustrated in FIG. 3 is a capacitively coupled plasma processing apparatus.

The plasma processing apparatus 10 includes a chamber body 12. The chamber body 12 has a substantially cylindrical shape. The chamber body 12 provides a space therein as an internal space 12c. The chamber body 12 is made of, for example, aluminum. The chamber body 12 is connected to a ground potential. A plasma-resistant film is formed on the inner wall surface of the chamber body 12, that is, the wall surface defining the internal space 12c. The film may be a ceramic film such as a film formed through an anodizing or a film formed of yttrium oxide. An opening 12g is formed in the sidewall 12s of the chamber body 12. The wafer W passes through the opening 12g when being carried into/out of the internal space 12c. The opening 12g can be opened and closed by a gate valve 14. The gate valve 14 is provided along the sidewall 12s.

A support 15 is provided in the internal space 12c. The support 15 extends upward from the bottom of the chamber body 12. The support 15 has a substantially cylindrical shape. The support 15 is formed of an insulating material such as quartz. A stage 16 is further provided in the internal space 12c. The stage 16 is supported by the support 15. The stage 16 is configured to support the wafer W placed thereon. The wafer W may have a disk shape. The stage 16 includes a lower electrode 18 and an electrostatic chuck 20.

The lower electrode 18 includes a first plate 18a and a second plate 18b. The first plate 18a and the second plate 18b are made of a metal such as aluminum. Each of the first plate 18a and the second plate 18b has a substantially disk shape. The second plate 18b is provided on the first plate 18a, and is electrically connected to the first plate 18a.

On the second plate 18b, an electrostatic chuck 20 is provided. The electrostatic chuck 20 includes an insulating layer and an electrode embedded in the insulating layer. A DC power supply 22 is electrically connected to the electrode of the electrostatic chuck 20 via a switch 23. When a voltage from the DC power supply 22 is applied to the electrode of the electrostatic chuck 20, an electrostatic attraction force is generated between the electrostatic chuck 20 and the wafer W. The wafer W is attracted to the electrostatic chuck 20 by the generated electrostatic attraction, and is held by the electrostatic chuck 20.

On the peripheral edge of the second plate 18b, a focus ring 24 is disposed to surround the edge of the wafer W and the electrostatic chuck 20. The focus ring 24 is provided in order to improve the uniformity of plasma processing. The focus ring 24 is formed of a material appropriately selected according to the plasma processing, and is formed of, for example, quartz.

Inside the second plate 18b, a flow path 18f is provided. A coolant is supplied to the flow path 18f from a chiller unit provided outside the chamber body 12 through a pipe 26a. The coolant supplied to the flow path 18f is returned to the chiller unit through a pipe 26b. That is, the coolant is circulated between the chiller unit and the flow path 18f. By controlling the temperature of the coolant by the chiller unit, the temperature of the wafer W supported by the electrostatic chuck 20 is controlled.

The plasma processing apparatus 10 is provided with a gas supply line 28. The gas supply line 28 supplies a heat transfer gas, such as He gas, from the heat transfer gas supply mechanism to the space between the top surface of the electrostatic chuck 20 and the rear surface of the wafer W.

The plasma processing apparatus 10 further includes an upper electrode 30. The upper electrode 30 is provided above the stage 16 to be substantially parallel to the lower electrode 18. The upper electrode 30 closes the upper opening of the chamber body 12 together with a member 32. The member 32 is insulative. The upper electrode 30 is supported in the upper portion of the chamber body 12 via the member 32.

The upper electrode 30 includes a ceiling plate 34 and a support 36. The ceiling plate 34 faces the internal space 12c. The ceiling plate 34 is provided with a plurality of gas ejection holes 34a. The ceiling plate 34 is formed of, for example, silicon, but is not limited thereto. Alternatively, the ceiling plate 34 may have a structure in which a plasma-resistant film is provided on the surface of an aluminum base material. The film may be a ceramic film such as a film formed through an anodizing or a film formed of yttrium oxide.

The support 36 is configured to detachably support the ceiling plate 34. The support 36 may be formed of a conductive material such as aluminum. A gas diffusion chamber 36a is provided inside the support 36. A plurality of gas holes 36b extends downward from the gas diffusion chamber 36a. The plurality of gas holes 36b communicate with the plurality of gas ejection holes 34a, respectively. The support 36 has a gas inlet 36c formed therein to guide the processing gas to the gas diffusion chamber 36a. A gas supply pipe 38 is connected to the gas inlet 36c.

To the gas supply pipe 38, a gas source group 40 is connected via a valve group 42 and a flow rate controller group 44. The gas source group 40 includes a plurality of gas sources for a first gas, a second gas, a third gas, and a cleaning gas. The first gas, the second gas, the third gas, and the cleaning gas will be described later.

The valve group 42 includes a plurality of valves, and the flow rate controller group 44 includes a plurality of flow rate controllers such as mass flow controllers. Each of the gas sources of the gas source group 40 is connected to the gas supply pipe 38 through a corresponding valve of the valve group 42 and a corresponding flow rate controller of the flow rate controller group 44. The plasma processing apparatus 10 is capable of supplying the gas from at least one gas source among the plurality of gas sources of the gas source group 40 to the internal space 12c at an individually regulated flow rate.

A baffle plate 48 is provided between the support 15 and the sidewall 12s of the chamber body 12. The baffle plate 48 may be made, for example, by coating an aluminum base material with ceramic such as yttrium oxide. A large number of through holes are formed in the baffle plate 48. Under the baffle plate 48, an exhaust pipe 52 is connected to the bottom of the chamber body 12. An exhaust apparatus 50 is connected to the exhaust pipe 52. The exhaust apparatus 50 includes a pressure controller such as an automatic pressure control valve, and a vacuum pump such as a turbo molecular pump, and is capable of depressurizing the internal space 12c.

The plasma processing apparatus 10 further includes a first radio frequency power supply 62. The first radio frequency power supply 62 is a power supply configured to generate first radio frequency power for plasma generation. The frequency of the first radio frequency power is in a range of 27 to 100 MHz, for example, 60 MHz. The first radio frequency power supply 62 is connected to the upper electrode 30 via a matcher 63. The matcher 63 includes a circuit configured to match the output impedance of the first radio frequency power supply 62 with the input impedance on the load side (the upper electrode 30 side). In addition, the first radio frequency power supply 62 may be connected to the lower electrode 18 via the matcher 63. When the first radio frequency power supply 62 is connected to the lower electrode 18, the upper electrode 30 is connected to a ground potential.

The plasma processing apparatus 10 further includes a second radio frequency power supply 64. The second radio frequency power supply 64 is configured to generate second radio frequency power for bias to draw ions into the wafer W. The frequency of the second radio frequency power is lower than the frequency of the first radio frequency power. The frequency of the second radio frequency power is in a range of 400 kHz to 13.56 MHz, for example, 400 kHz. The second radio frequency power supply 64 is connected to the lower electrode 18 via a matcher 65. The matcher 65 has a circuit configured to match the output impedance of the second radio frequency power supply 64 with the input impedance on the load side (the lower electrode 18 side).

In an embodiment, the plasma processing apparatus 10 may further include a controller Cnt. The controller Cnt is a computer including, for example, a processor, a storage device, an input device, and a display device, and the like, and controls each part of the plasma processing apparatus 10. Specifically, the controller Cnt executes a control program stored in the storage device to control each part of the plasma processing apparatus 10 based on recipe data stored in the storage device. Thus, the plasma processing apparatus 10 executes a process specified by the recipe data. For example, the controller Cnt controls each part of the plasma processing apparatus 10 based on the recipe data for the method MT.

When executing plasma processing using this plasma processing apparatus 10, the gas from a gas source selected from the plurality of gas sources in the gas source group 40 is supplied to the internal space 12c. In addition, the internal space 12c is depressurized by the exhaust apparatus 50. Then, the gas supplied to the internal space 12c is excited by a radio frequency electric field generated by the radio frequency power from the first radio frequency power supply 62. As a result, plasma is generated in the internal space 12c. In addition, the second radio frequency power is supplied to the lower electrode 18. As a result, the ions in the plasma are accelerated toward the wafer W. The wafer W is etched by irradiating the wafer W with ions and/or radicals accelerated in this way.

The shape of the mask layer L1 illustrated in FIG. 2 in which the method MT is carried out will be further described with reference to FIGS. 4, 5, 6, and 7. Each of FIGS. 4 to 7 illustrates an example of the shape of the mask layer L1 illustrated in FIG. 2 in a plan view. The mask layer L1 illustrated in each of FIGS. 4 to 7 has a plurality of convex portions K1. The plurality of convex portions K1 is arranged in translational symmetry in a plan view on the surface SF of the multilayer film L2.

Figure 4:
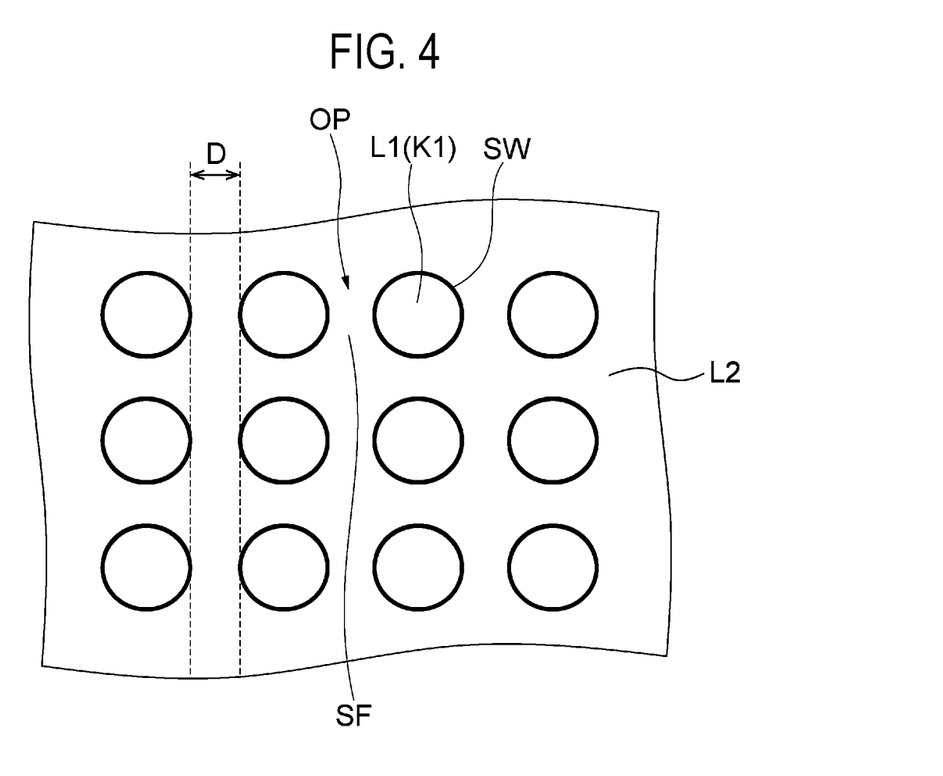
FIG. 4 is a plan view illustrating the shape of a portion of an exemplary mask layer.
Figure 6:
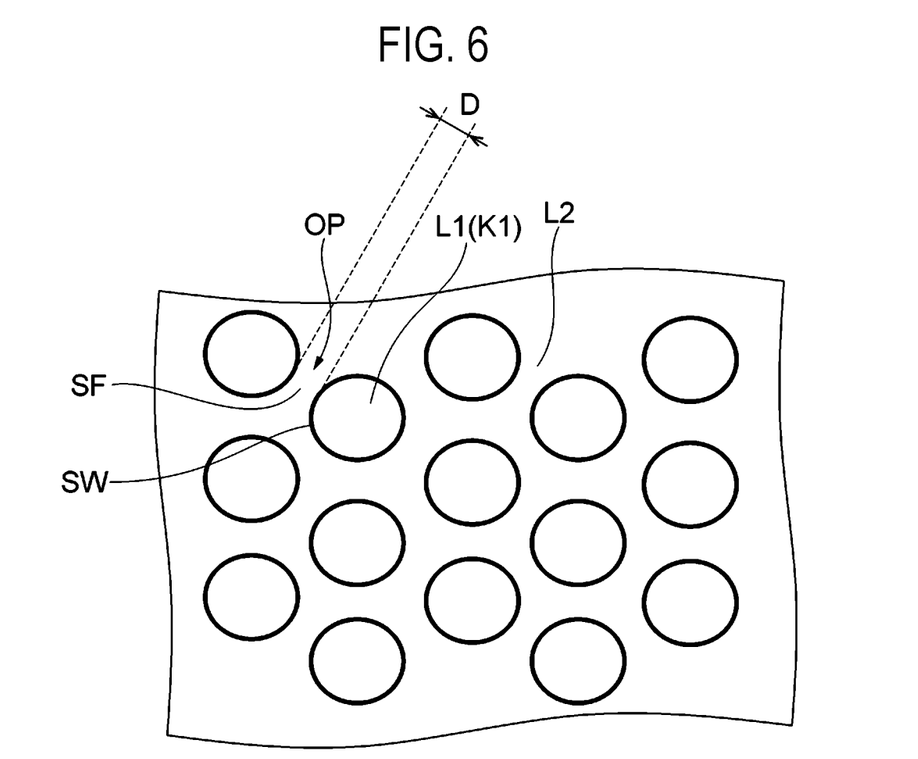
FIG. 6 is a plan view illustrating the shape of a portion of another exemplary mask layer.

The mask layer L1 illustrated in each of FIGS. 4 and 6 has circular convex portions K1 in a plan view. The convex portions K1 illustrated in each of FIGS. 4 and 6 have a columnar shape and has a circular cross section. The plurality of convex portions K1 illustrated in FIG. 4 is arranged along a square grid, and the plurality of convex portions K1 illustrated in FIG. 6 is arranged along a triangular grid.

Figure 5:
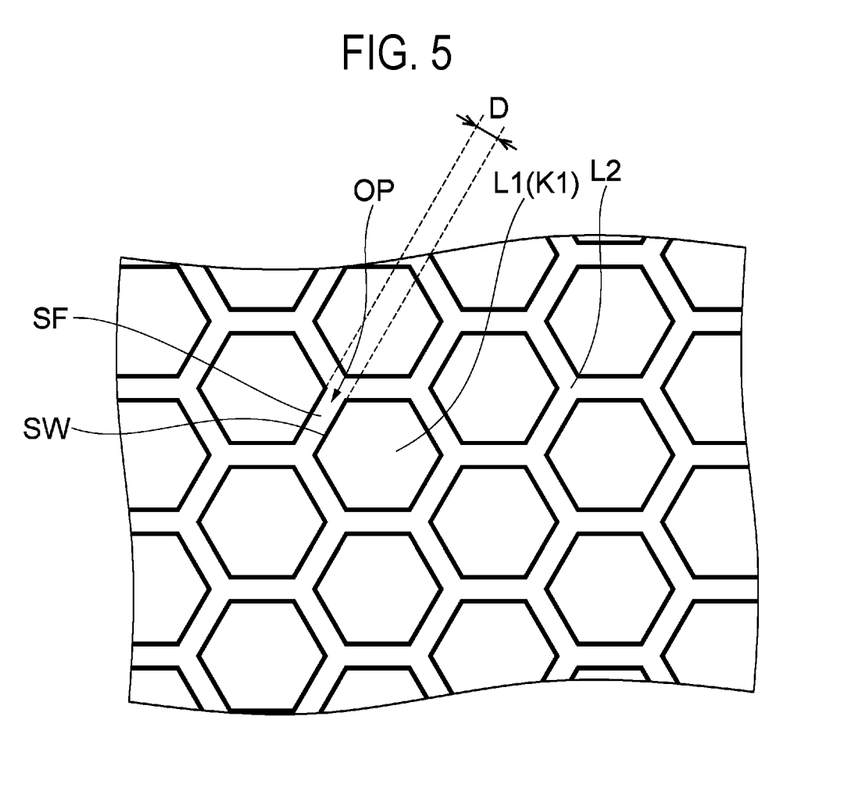
FIG. 5 is a plan view illustrating the shape of a portion of another exemplary mask layer.
Figure 7:
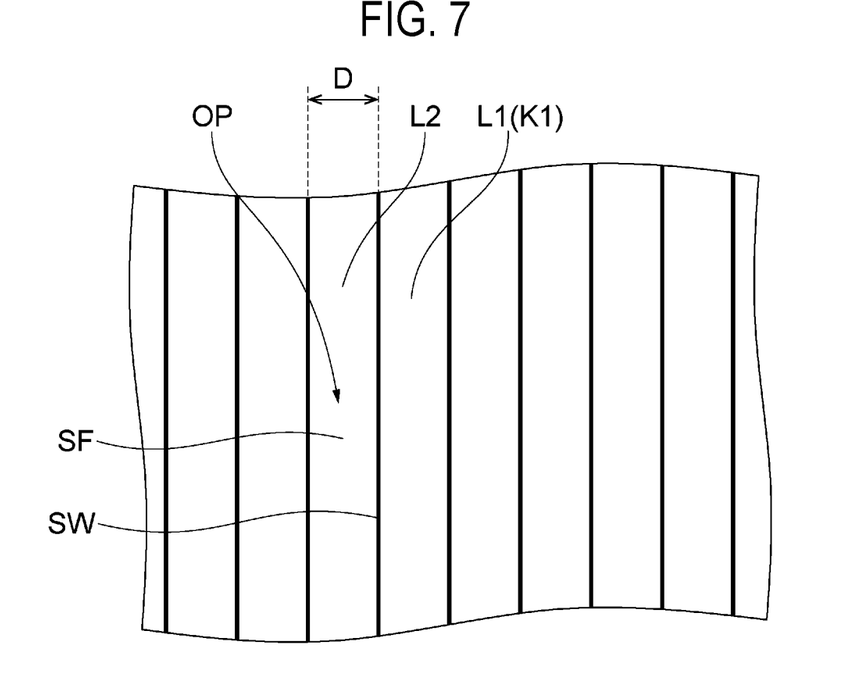
FIG. 7 is a plan view illustrating the shape of a portion of another exemplary mask layer.

The mask layer L1 illustrated in FIG. 5 has hexagonal convex portions K1 in a plan view. Each of the convex portions K1 illustrated in FIG. 5 has a columnar shape and a hexagonal cross section. The mask layer L1 illustrated in FIG. 7 is provided in a line-and-space shape. The plurality of convex portions K1 illustrated in FIG. 7 is provided in a plurality of line shapes in a plan view.

The mask layer L1 is not limited to those illustrated in FIGS. 4 to 7, and may have convex portions K1 having various cross-sectional shapes, and the orientation of translational symmetry may also have various directions.

Figure 8:
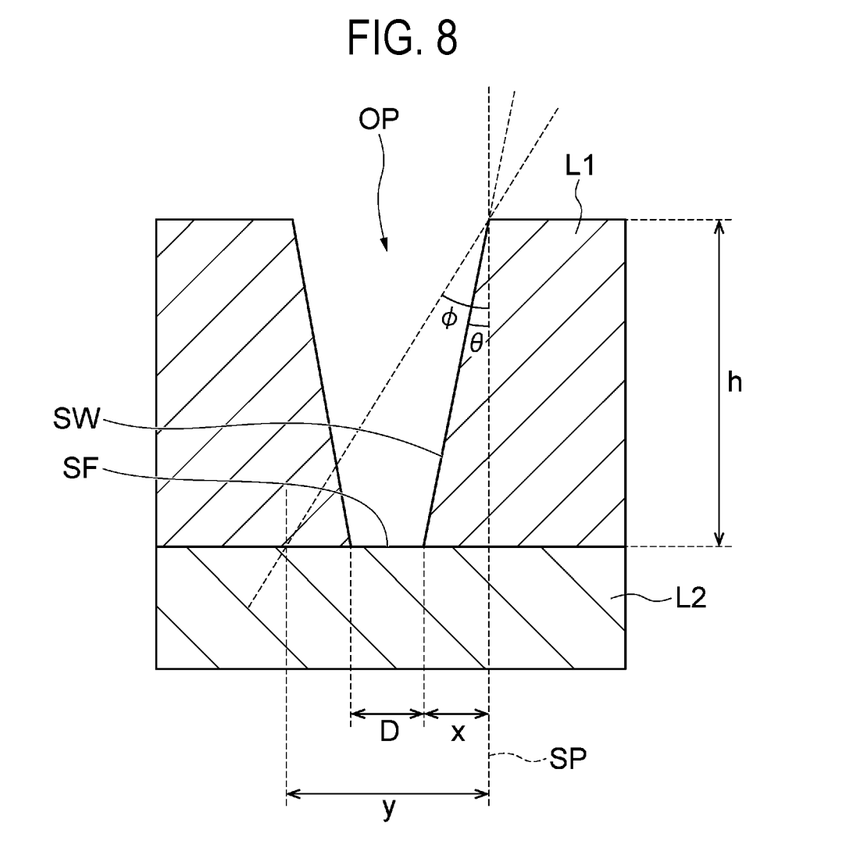
FIG. 8 is a view for describing an aspect ratio of an exemplary mask layer.

An aspect ratio of the convex portion K1 of the mask layer L1 will be described with reference to FIG. 8. The aspect ratio of the convex portion K1 is set such that ions IN can collide with sidewalls SW. It is assumed that the height of the mask layer L1 on the surface SF of the multilayer film L2 is h nm. It is assumed that the distance between two adjacent sidewalls SW of the mask layer L1 which define a portion of the exposed space OP on the surface SF is D nm.

The aspect ratio (h/D) of the convex portion K1 obtained by dividing h by D satisfies a condition: $h/D \geq 1/(\tan(\varphi) - \tan(\theta))$. $\theta$ indicates an inclination angle of the sidewalls SW with respect to the vertical plane SP which intersects the sidewalls SW and is perpendicular to the surface SF. $\varphi$ indicates an upper limit of an incident angle of ions generated by sputtering on the vertical plane SP. The incident angle $\varphi$ is larger than the inclination angle $\theta$. In particular, when the inclination angle $\theta$ is 0 degrees, the above condition is $h/D \geq 1/\tan(\varphi)$. In the case of etching (RIE) in a sparse pattern, since the machining limit angle may be 10 degrees ($\varphi=10$ degrees), $\varphi$ can satisfy 0 degrees $\leq \varphi \leq 10$ degrees. Therefore, when $\theta=0$ degrees and the machining limit angle is 10 degrees ($\varphi=10$ degrees), h/D may satisfy the condition of $h/D \geq 1/\tan(10°)$.

Figure 9:
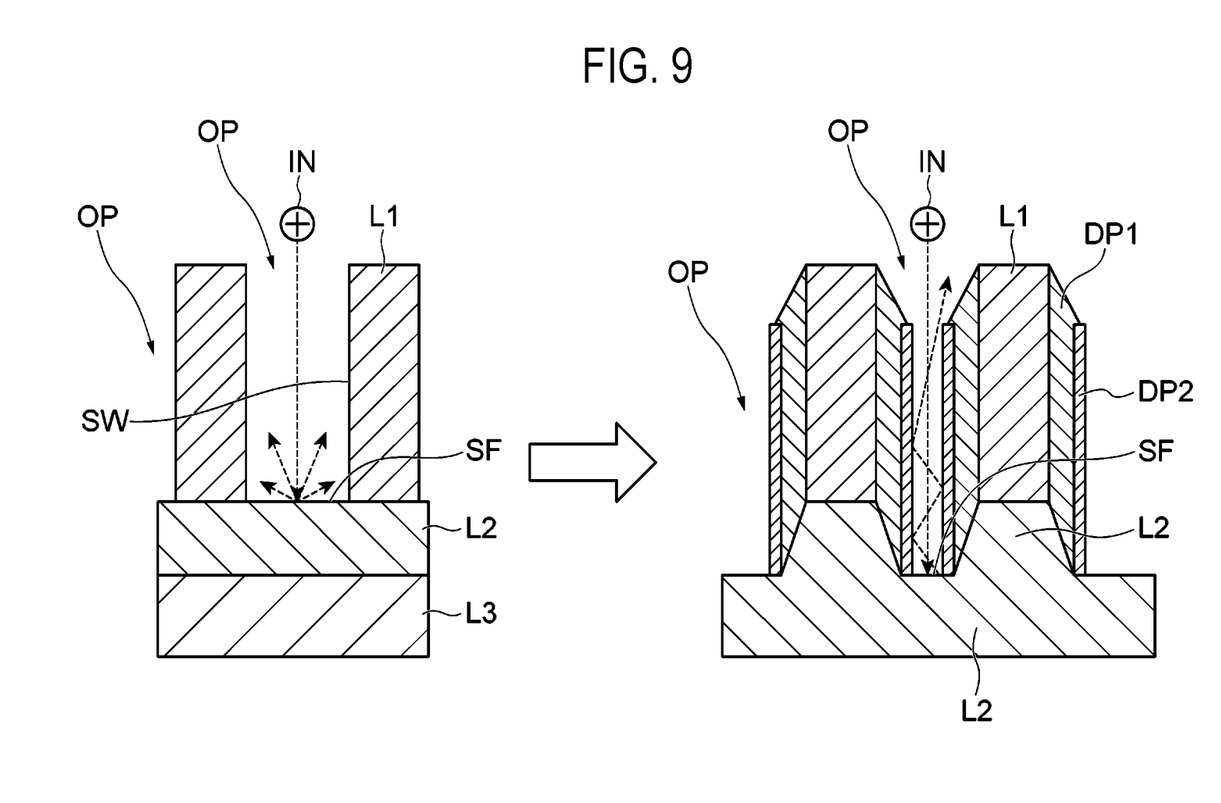
FIG. 9 is a view illustrating a state of etching of a multilayer film by sputtering.

Reference is made to FIGS. 1 and 9. The method MT according to an embodiment mainly includes step ST1 and step ST2, and is executed by, for example, the plasma processing apparatus 10 having the configuration illustrated in FIG. 3. In step ST1, the wafer W is accommodated in the internal space 12c. The wafer W is placed on the electrostatic chuck 20 of the stage 16 and held by the electrostatic chuck 20.

In the subsequent step ST2, the multilayer film L2 is etched by sputtering using ions IN in the plasma generated from the processing gas supplied into the internal space 12c. The processing gas includes a rare gas. The rare gas may include at least one among Ar gas, Ne gas, and Kr gas. The processing gas may further include oxygen gas, fluorine gas, fluorocarbon gas, alcohol gas, halogen gas, hydrocarbon gas, carbon dioxide gas, hydrogen gas, and nitrogen gas together with the rare gas.

In step ST2, the processing gas is supplied from the gas source group 40 to the internal space 12c. In addition, the pressure in the internal space 12c is set to a specified pressure by the exhaust apparatus 50. In addition, the first radio frequency power is supplied from the first radio frequency power supply 62 for the generation of plasma. In step ST2, the processing gas is excited by a radio frequency electric field based on the first radio frequency power in the internal space 12c, so plasma of the processing gas is generated. In step ST2, the second radio frequency power supply 64 supplies the second radio frequency power to the lower electrode 18. When the second radio frequency power is supplied to the lower electrode 18, the ions IN in the plasma are drawn to be irradiated onto the wafer W.

In step ST2, since the ions IN from the plasma generated from the processing gas collide with the multilayer film L2, the multilayer film L2 is etched. That is, in step ST2, the multilayer film L2 is etched by the sputtering with ions IN. By executing this step ST2, the multilayer film L2 is etched in an exposed space OP exposed from the mask layer L1, and the pattern of the mask layer L1 is transferred to the multilayer film L2. Since the multilayer film L2 containing the non-volatile material is scraped off by the sputtering with the ions IN, the non-volatile material is attached to the sidewalls SW of the mask layer L1 (including the sidewalls formed on the multilayer film L2 by etching; the same applies hereinafter), whereby a deposited film DP1 is formed.

Due to the deposited film DP1, the distance between two adjacent convex portions K1 of the mask layer L1 may be narrowed. However, the ions IN collide with the deposited film DP1, and further, the non-volatile materials scraped and blown off from the multilayer film L2 collide with the deposited film DP1 multiple times in the process of being blown off from the multilayer film L2, whereby the deposited film DP1 is scraped off. Therefore, the increase in the thickness of the deposited film DP1 can be sufficiently suppressed. The surface of the deposited film DP1 is modified by the collision of ions IN and the collision of the non-volatile material blown off from the multilayer film L2, and thus a modified layer DP2 is formed.

In the conventional etching of a MTJ of an MRAM using sputtering, the non-volatile materials such as pillars are scraped and a deposited layer of the scraped non-volatile material is formed on sidewalls of an etched groove including the sidewalls of the mask layer. If the pillars or the like of the non-volatile material can be vertically machined in the etching by sputtering, both a sufficient residual mask film and miniaturization of a machining dimension can be achieved. However, since the machined shape is provided with a taper angle, it becomes difficult to achieve both a sufficient residual mask film and miniaturization of a machining dimension. In addition, in a high-density pillar or the like required for a large-capacity MRAM, vertical machining is difficult even in ion milling.

In contrast, with the method MT according to the embodiment, since the dimensional increase due to a deposited film attached to the sidewalls SW can be reduced by the mask layer L1 having a high aspect ratio, whereby it is possible to perform vertical machining by etching the convex portions K1. For example, the method MT can be used in machining MTJ of a high-density MRAM in which the space between the pillars is made narrow. By using the method MT, it becomes possible to vertically machine a metal of a non-volatile material, an insulating material, and structures of a multilayer film containing the previous material such as pillars, lines and spaces, holes, ring masks, and dummy sidewalls, in addition to the MTJ of the MRAM.

In addition, by adding oxygen gas, alcohol gas, carbon dioxide gas, fluorine gas, and nitrogen gas to the processing gas containing a rare gas and adjusting the flow rate thereof to form an insulating compound, it becomes possible to take measures against a short circuit. In addition, by containing hydrogen gas, fluorocarbon gas, fluorine gas, and halogen gas, it becomes possible to perform a continuous machining of a multilayer film including silicon and a silicon compound.

Furthermore, due to the base layer L3 of $SiO_2$, SiN, or the like, it is possible to cover the sidewalls of the pillars or the like formed from the multilayer film L2 by the method MT with $SiO_2$, SiN, or the like so that the surface of a device can be inactivated.

Although various exemplary embodiments have been described above, the present disclosure is not limited to the exemplary embodiments described above, and various additions, omissions, substitutions, and changes may be made. In addition, elements in different embodiments may be combined to form other embodiments.

Figure 10:
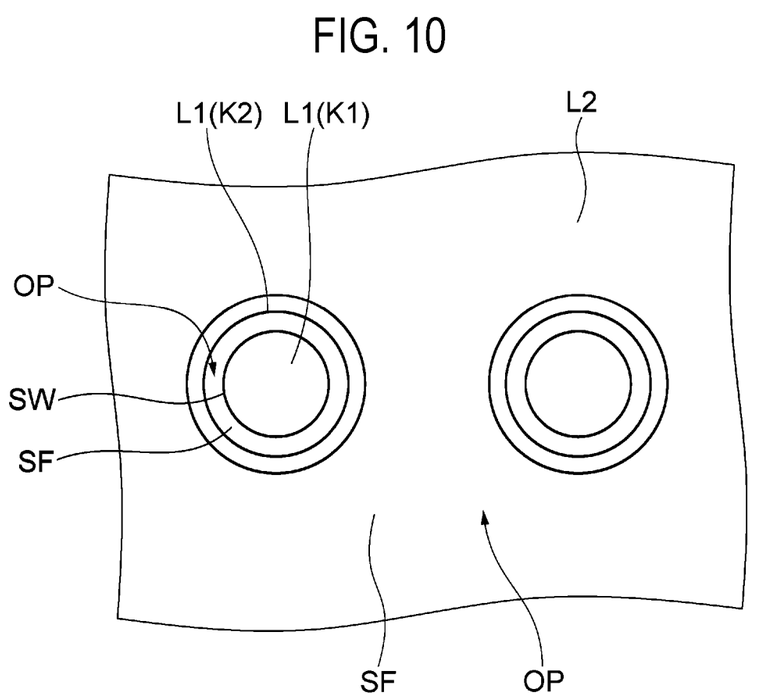
FIG. 10 is a plan view illustrating the shape of a portion of an exemplary mask layer which includes convex portions that define a portion of a pattern and outer peripheral regions each surrounding the outer periphery of the convex portion.
Figure 11:
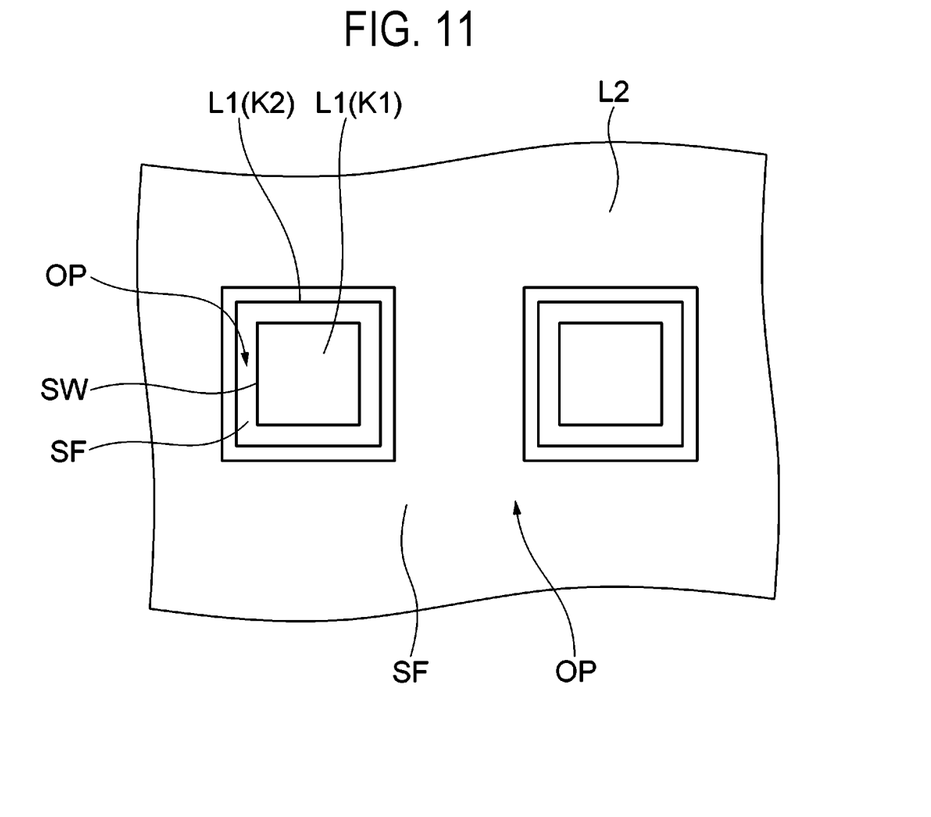
FIG. 11 is a plan view illustrating the shape of a portion of another exemplary mask layer which includes convex portions that define a portion of a pattern and outer peripheral regions each surrounding the outer periphery of the convex portion.

For example, as illustrated in FIGS. 10 and 11, a mask layer L1 may include a convex portion K1 which defines a portion of a pattern and an outer peripheral region K2 which surrounds an outer periphery of the convex portion K1. An exposed space OP includes a space between the convex portion K1 and the outer peripheral region K2. Even if the distance (D) between two adjacent convex portions K1 is relatively large and the above-described condition related to the aspect ratio of the convex portions K1 is not satisfied, it is possible to provide the outer peripheral regions K2 such that the distance D between the outer peripheral regions K2 and the convex portions K1 surrounded by the outer peripheral regions K2 satisfies the above-described condition. In the convex portion K1 surrounded by such an outer peripheral region K2, vertical machining by etching becomes possible. The outer peripheral region K2 is finally removed by etching after step ST2.

Figure 12:
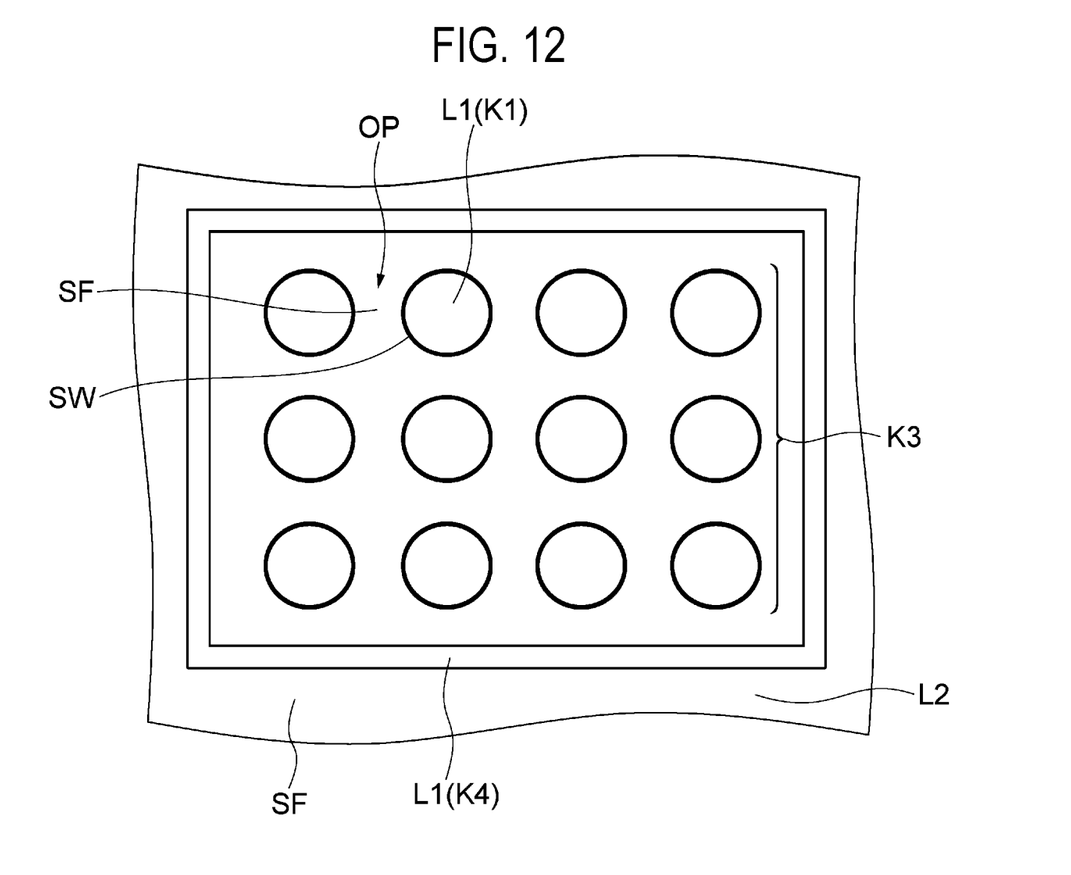
FIG. 12 is a plan view illustrating the shape of a portion of an exemplary mask layer which includes a pattern region including a plurality of convex portions that define a pattern and an outer region provided outside the pattern region.

As shown in FIG. 12, a mask layer L1 may include a pattern region K3 having a plurality of convex portions K1 defining a pattern, and an outer region K4 provided outside the pattern region K3. An exposed space OP includes a space between the pattern region K3 and the outer region K4. Two adjacent convex portions K1 may not be provided in the outer peripheral region of the pattern region K3, and the above-described condition related to the aspect ratio of the convex portions K1 may not be satisfied. Even in such a case, in the outer peripheral region of the pattern region K3, the outer region K4 may be provided such that the distance D between the convex portions K1 adjacent to the outer region K4 and the outer region K4 satisfies the above condition. In the convex portions K1 adjacent to the outer region K4, vertical machining by etching becomes possible. The outer region K4 is finally removed by etching after step ST2.

According to an exemplary embodiment, there is provided a technique for suppressing attachment of sputtered atoms to etching sidewalls in a machining method using a physical sputtering phenomenon.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method of etching a wafer by sputtering using ions in plasma generated by a plasma processing apparatus,
   wherein the wafer includes a multilayer film containing a non-volatile material and a mask layer provided on a surface of the multilayer film, and an exposed space that is a region not covered by the mask layer is provided on the surface so that the surface is exposed in the exposed space,
   wherein an aspect ratio h/D obtained by dividing a height h of the mask layer on the surface by a distance D between two adjacent sidewalls of the mask layer which define a portion of the exposed space on the surface satisfies a condition: $h/D \geq 1/(\tan(\varphi) - \tan(\theta))$, where $\theta$ indicates an inclination angle of one sidewall of the two adjacent sidewalls with respect to a vertical plane intersecting the one sidewall and perpendicular to the surface, and $\varphi$ indicates an upper limit of an incidence angle of ions generated by sputtering on the vertical plane,
   wherein $\varphi$ is larger than $\theta$,
   wherein the etching method comprises:
   accommodating the wafer in an internal space of a chamber of the plasma processing apparatus; and
   etching the multilayer film by sputtering using the ions in plasma generated from a processing gas supplied into the internal space, and
   wherein the mask layer includes the one sidewall having the inclination angle with respect to the vertical plane.

2. The etching method of claim 1, wherein the processing gas includes a rare gas.

3. The etching method of claim 1, wherein the non-volatile material included in the multilayer film includes at least one among any one metal included in a metal group consisting of Ru, Ir, Co, Fe, Mg, Pt, W, Mo, and Ni, an alloy compound, a metal oxide, and a metal nitride,
the alloy compound is a compound composed of two or more metals included in the metal group,
the metal oxide is an oxide of any one metal included in the metal group, and
the metal nitride is a nitride of any one metal included in the metal group.

4. The etching method according to claim 1, wherein a material of the mask layer includes at least one among Ti, TiN, Ta, and TaN.

5. An etching method of etching a wafer by sputtering using ions in plasma generated by a plasma processing apparatus,
wherein the wafer includes a multilayer film containing a non-volatile material and a mask layer provided on a surface of the multilayer film, and an exposed space that is a region not covered by the mask layer is provided on the surface so that the surface is exposed in the exposed space,
wherein an aspect ratio h/D obtained by dividing a height h of the mask layer on the surface by a distance D between two adjacent sidewalls of the mask layer which define a portion of the exposed space on the surface satisfies a condition: $h/D \geq 1/(\tan(\varphi) - \tan(\theta))$, where $\theta$ indicates an inclination angle of one sidewall of the two adjacent sidewalls with respect to a vertical plane intersecting the one sidewall and perpendicular to the surface, and $\varphi$ indicates an upper limit of an incidence angle of ions generated by sputtering on the vertical plane,
wherein $\varphi$ is larger than $\theta$,
wherein the etching method comprises:
accommodating the wafer in an internal space of a chamber of the plasma processing apparatus; and
etching the multilayer film by sputtering using the ions in plasma generated from a processing gas supplied into the internal space,
wherein, when $\theta$ is 0 degrees, the condition is $h/D \geq 1/\tan(10°)$, and
wherein the mask layer includes a convex portion which defines a portion of a pattern and an outer peripheral region which surrounds an outer periphery of the convex portion,
the exposed space includes a space between the convex portion and the outer peripheral region, and
the outer peripheral region is removed after the etching the multilayer film.

6. The etching method of claim 5, wherein the mask layer includes a pattern region having a plurality of convex portions which defines a pattern, and an outer region provided outside the pattern region,
the exposed space includes a space between the pattern region and the outer region, and
the outer region is removed after the etching the multilayer film.

7. The etching method of claim 6, wherein the processing gas includes a rare gas.

8. The etching method of claim 7, wherein the processing gas further includes oxygen gas, fluorine gas, fluorocarbon gas, alcohol gas, halogen gas, hydrocarbon gas, carbon dioxide gas, hydrogen gas, and nitrogen gas.

9. The etching method of claim 8, wherein the rare gas included in the processing gas includes at least one among Ar gas, Ne gas, and Kr gas.

10. The etching method of claim 9, wherein the non-volatile material included in the multilayer film includes at least one among any one metal included in a metal group consisting of Ru, Ir, Co, Fe, Mg, Pt, W, Mo, and Ni, an alloy compound, a metal oxide, and a metal nitride,
the alloy compound is a compound composed of two or more metals included in the metal group,
the metal oxide is an oxide of any one metal included in the metal group, and
the metal nitride is a nitride of any one metal included in the metal group.

11. The etching method according to claim 10, wherein a material of the mask layer includes at least one among Ti, TiN, Ta, and TaN.

12. The etching method of claim 7, wherein the rare gas included in the processing gas includes at least one among Ar gas, Ne gas, and Kr gas.

13. An etching method of etching a wafer by sputtering using ions in plasma generated by a plasma processing apparatus,
wherein the wafer includes a multilayer film containing a non-volatile material and a mask layer provided on a surface of the multilayer film, and an exposed space that is a region not covered by the mask layer is provided on the surface so that the surface is exposed in the exposed space,
wherein an aspect ratio h/D obtained by dividing a height h of the mask layer on the surface by a distance D between two adjacent sidewalls of the mask layer which define a portion of the exposed space on the surface satisfies a condition: $h/D \geq 1/(\tan(\varphi) - \tan(\theta))$, where $\theta$ indicates an inclination angle of one sidewall of the two adjacent sidewalls with respect to a vertical plane intersecting the one sidewall and perpendicular to the surface, and $\varphi$ indicates an upper limit of an incidence angle of ions generated by sputtering on the vertical plane,
wherein $\varphi$ is larger than $\theta$,
wherein the etching method comprises:
accommodating the wafer in an internal space of a chamber of the plasma processing apparatus; and
etching the multilayer film by sputtering using the ions in plasma generated from a processing gas supplied into the internal space, and
wherein the mask layer includes a convex portion which defines a portion of a pattern and an outer peripheral region which surrounds an outer periphery of the convex portion,
the exposed space includes a space between the convex portion and the outer peripheral region, and
the outer peripheral region is removed after the etching the multilayer film.

14. An etching method of etching a wafer by sputtering using ions in plasma generated by a plasma processing apparatus,
wherein the wafer includes a multilayer film containing a non-volatile material and a mask layer provided on a surface of the multilayer film, and an exposed space that is a region not covered by the mask layer is provided on the surface so that the surface is exposed in the exposed space,
wherein an aspect ratio h/D obtained by dividing a height h of the mask layer on the surface by a distance D between two adjacent sidewalls of the mask layer which define a portion of the exposed space on the surface satisfies a condition: $h/D \geq 1/(\tan(\varphi) - \tan(\theta))$, where $\theta$ indicates an inclination angle of one sidewall of the two adjacent sidewalls with respect to a vertical plane intersecting the one sidewall and perpendicular to the surface, and $\varphi$ indicates an upper limit of an incidence angle of ions generated by sputtering on the vertical plane, wherein $\varphi$ is larger than $\theta$, wherein the etching method comprises:

accommodating the wafer in an internal space of a chamber of the plasma processing apparatus; and etching the multilayer film by sputtering using the ions in plasma generated from a processing gas supplied into the internal space, and wherein the mask layer includes a pattern region having a plurality of convex portions which defines a pattern, and an outer region provided outside the pattern region, the exposed space includes a space between the pattern region and the outer region, and the outer region is removed after the etching the multilayer film.

\* \* \* \* \*